United States Patent [19]

Mizuko et al.

[11] Patent Number: 4,675,786
[45] Date of Patent: Jun. 23, 1987

[54] FLEXIBLE CIRCUIT BOARD AND METHOD OF MAKING THE SAME

[75] Inventors: Tsutomu Mizuko; Toshiyuki Tsukahara, both of Ami; Masahiro Yoshida, Omigawa; Koji Nemoto, Nakaminato, all of Japan

[73] Assignee: Nippon Mektron, Ltd., Japan

[21] Appl. No.: 747,333

[22] Filed: Jun. 21, 1985

[30] Foreign Application Priority Data

Jun. 27, 1984 [JP] Japan .................................. 59-132253

[51] Int. Cl.$^4$ .............................................. H05K 1/00
[52] U.S. Cl. .................................... 361/398; 361/402; 361/409; 361/411; 174/68.5; 204/15
[58] Field of Search ............... 361/398, 402, 409, 411; 174/68.5; 427/92, 98; 204/15

[56] References Cited

U.S. PATENT DOCUMENTS

| | | | |
|---|---|---|---|
| 4,062,750 | 12/1977 | Butler | 204/15 X |
| 4,182,781 | 1/1980 | Hooper et al. | 427/98 |
| 4,525,383 | 6/1985 | Saito | 427/98 X |

FOREIGN PATENT DOCUMENTS 52-27362  3/1977  Japan .................................... 204/15

*Primary Examiner*—Arthur T. Grimley
*Assistant Examiner*—Jane K. Lau
*Attorney, Agent, or Firm*—Fishman & Dionne

[57] ABSTRACT

A flexible circuit board and method of making the same is presented wherein the circuit board includes conductive through-holes for installation of components and includes a sloping electrolytic plating portion between the through-hole portions and remaining flexible portions of the circuit board.

2 Claims, 3 Drawing Figures

FLEXIBLE CIRCUIT BOARD AND METHOD OF MAKING THE SAME

BACKGROUND OF THE INVENTION

This invention relates to a flexible circuit board which includes an installation portion for installing electronic parts and a flexible portion provided adjacent thereto; and a method of making the same. More particularly, this invention relates to a novel flexible circuit board wherein a desired electrolytic plating is provided over both the installation portion and an adjacent transition portion located between the installation portion and the flexible portion of the circuit board; and a method of making the same.

Flexible circuit boards are presently used in many areas as an effective circuit-providing means in various electrical and electronic instruments. One type of flexible circuit board is known which includes an installation portion on which electronic parts can be installed, and a flexible portion provided adjacent to the installation portion which does not have a parts installing capability. The general prior art technique used for manufacturing such a flexible circuit board having an installation portion and a flexible portion comprises initially preparing a flexible circuit board material by coating an electro-conductive foil, such as copper foil or the like, on both sides of a suitable flexible insulating base material. Next, through-holes for electrical connection are drilled at required locations on the material. A nonelectrolytic chemical plating layer is then provided over the entire board starting material so as to obtain an electrical connection through the through-holes. This nonelectrolytic plating step is followed by an electrolytic plating step so as to form an electrolytic plating layer over the nonelectrolytic chemical plating layer and thereby secure the electrical connection through said through-holes. Thereafter, desired circuit patterns are formed by an etching process, whereupon first circuit patterns having through-hole conductive parts are formed on both sides of the installation portion and a second circuit pattern adjoining one or both of the first circuit patterns is formed on one or both sides of the flexible portion provided adjacent to the installation portion.

In the above-described known technique for making such flexible circuit boards, an electrolytic plating having a hard or rigid texture is provided over the entire circuit pattern of the installation and the flexible portions; and consequently the flexibility of the flexible portion is reduced to a large extent. Moreover, a serious problem arises in that bending or flexing motion causes breakage of the circuit pattern at the location of the bending motion. As a means of eliminating this kind of problem at the flexible portion of the circuit board, a technique is known wherein a circuit pattern is provided on only one side of the flexible portion; and no plating layer is provided over that circuit pattern. Consequently, the flexibility of the flexible part is maintained and circuit breakage is prevented. See, for example, Japanese Utility Model Sho 56-54607 (1981) and Japan Patent Application Sho 57-79697 (1982).

In the above-mentioned prior art structure, wherein no plating layer is provided over the circuit pattern of the flexible portion, an electrolytic plating layer is coated over the conductive foil region of the installation portion, (whereas the flexible portion has the initial conductive foil alone). This results in a discontinuity forming at the boundary between the two portions. When circuit patterns are prepared under such a condition (by utilizing conventional photoresist and etching processes), it is difficult to form a circuit pattern accurately in the vicinity of the discontinuity portion due to the effect of the discontinuity. Accordingly, a problem develops in that the risk of circuit breakage at the discontinuity portion becomes higher due to stress concentration. Moreover, while it is necessary to mask the flexible portion in order to provide a nonelectrolytic chemical plating and an electrolytic plating for the installation portion alone, this masking process leads to complications of the overall process because the masking process requires a large number of steps; also the mask must be removed at a later stage of the process.

SUMMARY OF THE INVENTION

The above-discussed and other problems and deficiencies of the prior art are overcome or alleviated by the flexible circuit board and method of making the same of the present invention. The present invention resolves the above-described problems by providing a flexible circuit board having an installation portion in which a desired circuit pattern is provided on both sides thereof. Through-hole conductive parts are provided at desired locations in the circuit patterns; and an electrolytic plating layer is provided over the circuit pattern, the through-hole conductive portions, and a flexible portion, which is provided adjacent the installation portion, so that another circuit pattern, which is formed simultaneously with at least one of said circuit patterns (and which does not have an electrolytic plating layer on it), may be provided thereon. The flexible circuit board of the present invention includes a transition portion which connects the electrolytic plating layer present on the circuit pattern of the installation portion and the circuit pattern of the flexible portion. This transition section comprises a sloping electrolytic plating section provided between the installation and flexible portions.

In order to manufacture the above-described flexible circuit board in accordance with the present invention, a novel method for manufacturing is provided and comprises preparing an installation portion by using flexible circuit board material obtained by coating an electro-conductive foil on both sides of a flexible insulating base material; and forming a desired circuit pattern from the electro-conductive foil on both sides of the base. Through-hole conductive portions are also provided between the two sides at desired locations via an etching process and a through-hole conduction process, respectively. Simultaneously, a flexible portion having another circuit pattern formed contiguously with at least one of said circuit patterns by the etching process is provided adjacent to the installation portion. Next, after mounting a shield plate onto the flexible portion, an electrolytic plating process is conducted whereby electrolytic plating is provided over the circuit pattern, and the through-hole conductive portion to be formed in the installation portion. Simultaneously, a sloping electrolytic plating layer is provided over the circuit pattern to be formed in a transition section of the circuit board located between the installation and flexible portions. The shield plate used for forming the above-mentioned sloping electrolytic plating portion on the transition portion has a structure such that a desired gap is formed between the shield plate and the transition section or a portion thereof which is inclined upwardly from the transition section in the direction of the installation portion at a desired angle. The shield plate is readily mountable to, and dismountable from, the flexible portion; and the above-mentioned electrolytic plating process effected by utilizing such a shield plate can be carried out either prior or subsequent to the circuit patterning process.

Since the circuit pattern on the transition portion located between the installation portion and the flexible portion has a sloping electrolytic plating section thereon; and since the sloping electrolytic plating portion adjoins the electrolytic plating layer on the circuit pattern of the installation portion, the problems of the prior art wherein the circuit patterning is difficult at the discontinuity portion due to the discontinuity created by the presence and absence of the electrolytic plating, is conveniently eliminated. Also, stress concentrations at such a discontinuity portion are prevented and hence the risk of circuit breakage or the like is substantially eliminated. Moreover, the electrolytic plating process for the circuit pattern and the through-hole conductive portion of the installation portion can be carried out simultaneously with the sloping electrolytic plating process via the use of the aforementioned shield plate. It will be appreciated that such an electrolytic plating process can be conducted very easily, either prior or subsequent to the desired circuit patterning process.

BRIEF DESCRIPTION OF THE DRAWINGS

Referring now to the drawings, wherein like elements are numbered alike in the several FIGURES.

DESCRIPTION OF THE PREFERRED EMBODIMENT

Figure 1:
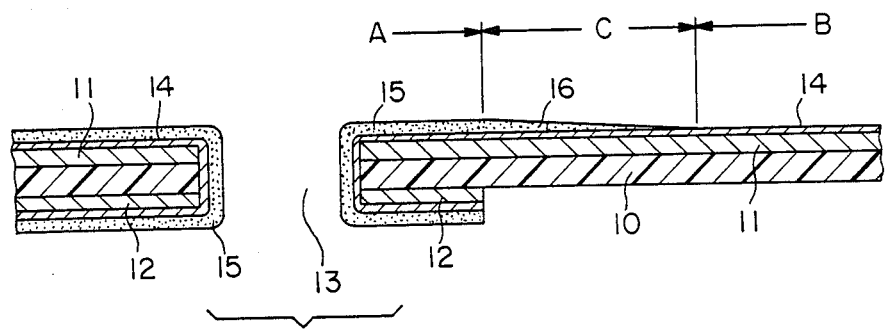
FIG. 1 is a cross-sectional elevation view of the flexible circuit board in accordance with the present invention.

Referring first to FIG. 1, a schematic partial cross-sectional view of the main elements of a flexible circuit board in accordance with the present invention is shown. In FIG. 1, a flexible base material 10, comprised of a suitable plastic film such a polyamide film, polyimide film or the like, and a metal foil such as aluminum foil or a desired circuit pattern 11 (comprised of an electro-conductive foil such as copper foil) is formed on one side of base material 10; and another circuit pattern 12 is formed at a predetermined location of the other, opposite side of base material 10. The region having the circuit pattern 12 constitutes and defines the installation portion A. In accordance with the present invention, a transition portion C is provided contiguous to installation portion A and a flexible portion B is connected to installation portion A via the transition portion C. Through-hole conductive means are provided in the installation portion A so as to afford thereto a capability of installing electronic parts thereon. Accordingly, through-hole 13 is provided for the installation of electronic parts while a nonelectrolytic chemical plating layer 14 is provided over the entire electro-conductive foil so as to secure adequate electrical conduction over the inner surface of through-hole 13 as shown in FIG. 1.

Preferably, plating layer 14 consists of a thin layer over the entirety of the circuit patterns 11 and 12.

An electrolytic plating layer 15 is provided at a desired thickness over circuit patterns 11 and 12, and the inner surface of through-hole 13. Electrolytic plating layer 15 terminates at a sloping electrolytic plating portion 16 provided over the circuit pattern 11 of the transition section C; and is not provided over circuit pattern 11 of flexible portion B.

In the flexible circuit board of FIG. 1 and in accordance with the present invention, the nonelectrolytic chemical plating layer 14 alone is provided over the flexible portion B, and no electrolytic plating layer (having a hard or rigid texture) is provided thereover. Hence, the flexibility of flexible portion B is well maintained. Moreover, since transition section C, having a sloping electrolytic plating portion 16 thereon, is provided between the flexible portion B and the installation portion A, stress concentration during bending motions or the like are reduced in comparison to circuit boards not having such a sloping electrolytic plating transition section. Consequently, the problem of the breakage of the circuit pattern 11 at the transition section C is substantially eliminated.

Figure 2:
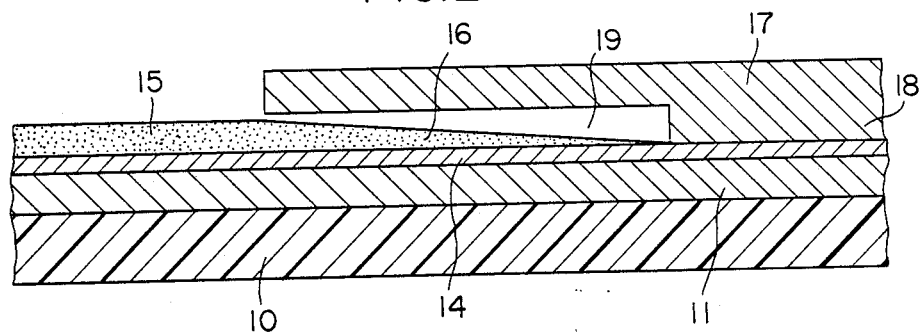
FIG. 2 is a cross-sectional elevation view of the circuit board of FIG. 1 and a first embodiment of a shield plate used in the method of the present invention.
Figure 3:
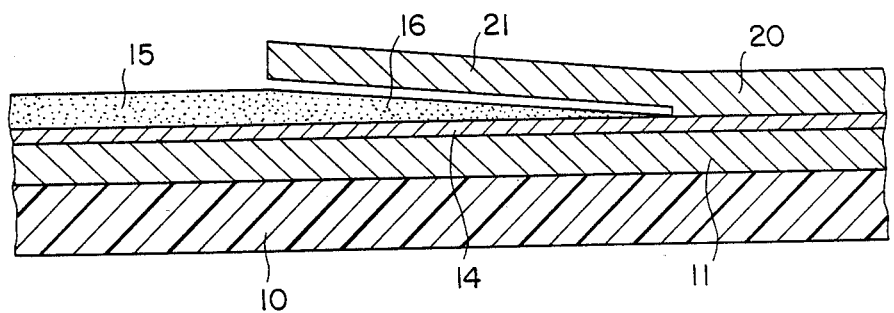
FIG. 3 is a cross-sectional elevation view, similar to FIG. 2, using another embodiment of a shield plate in accordance with the present invention.

During manufacture of a flexible circuit board of the present invention, initially a flexible circuit board substrate material having an electro-conductive foil 14 is provided on both sides of a base material 10. Next, desired through-holes are provided in the region corresponding to the installation portion A; and thereafter a nonelectrolytic chemical plating method is carried out over the inner surface of through-holes 13 and the entire surface of the electro-conductive foil 14, preferably to a thickness of 0.2 μm or more. Subsequently, as shown in FIGS. 2 and 3, a shield plate 17 or 20 is mounted to a region corresponding to the flexible portion B and an electrolytic plating layer 15 and a sloping electrolytic plating portion 16 are provided uniformly over only the installation portion A and the transition portion C. Thereafter, the shielded plate 17 or 20 is removed and a photoresist process and an etching process are conducted whereby desired circuit patterns 11 and 12 are formed.

In lieu of the technique described above, another technique may be used wherein subsequent to the nonelectrolytic chemical plating process for securing through-hole conduction, the photoresist process and the etching process are carried out to prepare the desired circuit patterns 11 and 12. Finally, an electrolytic plating process is carried out under conditions wherein a shield plate 17 or 20, as shown in FIG. 2 or 3, is mounted on flexible portion B and wherein the electrolytic plating layer 15 and sloping electrolytic plating portion 16 are prepared simultaneously over the circuit pattern 11, and the through-hole portions of the installation portion A and the transition portions C.

In the embodiment of FIG. 2, shield plate 17 mounted on flexible portion B has stepped section 18 which contacts the nonelectrolytic chemical plating layer 14 of flexible portion B. Because of stepped portion 18, a desired gap 19 is formed between shield plate 17 and transition portion C and a sloping electrolytic plating section 16 is formed on transition portion C at gap 19. In order to further facilitate the formation of such a slope of the electrolytic plating portion 16, it is preferable to use a shield plate 20 as shown in FIG. 3 which has a portion 21 sloped upwardly from transition portion C in the direction of installation portion A at a selected angle; the angle of the slope being varied by varying the angle of sloped section 21. For example, when the thickness of the electrolytic plating layer 15 is 12 μm, the angle of inclined or sloped section 21 is about 20°. Shield plate 17 or 20 may be mounted to the flexible portion B either by use of a suitable pinching means such as a clip, or by lightly adhering it to flexible portion B in combination with such a pinching means. In any event, shield plate 17 or 20 should be easily mountable to and dismountable from flexible portion B; and such mounting and dismounting processes should be easily effected.

It will be appreciated that although the FIGURES illustrate embodiments wherein the flexible portion B has a circuit pattern on only one side thereof, if necessary, such a circuit pattern may be prepared on both sides thereof by providing a transition portion C having the above-described structure on both sides of the board.

In accordance with the flexible circuit board and method of making the same of the present invention, a transition section on the circuit board having a sloping electrolytic plating portion formed simultaneously with the electrolytic plating layer of the installation portion is provided between the installation portion and the flexible portion. As a result, the electrolytic plating portion of the installation portion and the circuit pattern of the flexible portion are provided adjacent to each other without creating any discontinuity. Consequently, formation of the circuit patterns can be carried out securely and the breakage of the circuit pattern due to stress concentration is prevented. Moreover, high quality circuit board products having good flexibility can be obtained. The sloping electrolytic plating portion provided on the transition portion may be formed simultaneously with the electrolytic plating layer of the installation portion by mounting a shield plate on the flexible portion; the shield plate being easily mountable and dismountable in contrast to the prior art masking means and creates no risk of adversely affecting other process steps. The electrolytic plating process using such a shield plate can be conducted either prior to or subsequent to the circuit pattern formation step; which increases the degree of freedom in the process and permits the optimal combination of process steps depending upon the shape, function, etc. of the product.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A flexible circuit board comprising:
 a flexible insulative base material having electrically conductive material on two opposing sides thereof;
 circuit pattern means being formed in said conductive material on both sides of said base material;
 at least one through-hole conductive portion between said two sides at a selected location through said base material defining at least one installation portion;
 a first electrolytic plating layer being substantially uniform over said installation portion;
 a second electrolytic plating layer having a sloping portion adjacent said installation portion and defining a transition portion.

2. The circuit board of claim 1 including:
 a nonelectrolytic plating layer over said installation portion and said electrically conductive material.

* * * * *